United States Patent [19]

Baliga

[11] Patent Number: 5,396,087
[45] Date of Patent: Mar. 7, 1995

[54] INSULATED GATE BIPOLAR TRANSISTOR WITH REDUCED SUSCEPTIBILITY TO PARASITIC LATCH-UP

[75] Inventor: Bantval J. Baliga, Raleigh, N.C.

[73] Assignee: North Carolina State University, Raleigh, N.C.

[21] Appl. No.: 990,062

[22] Filed: Dec. 14, 1992

[51] Int. Cl.[6] .................. H01L 29/74; H01L 31/111; H01L 23/58; H01L 29/76
[52] U.S. Cl. .................................. 257/139; 257/133; 257/147; 257/212; 257/342
[58] Field of Search ............... 257/107, 133, 139, 337, 257/339, 341, 342, 347, 350, 378, 212, 147

[56] References Cited

U.S. PATENT DOCUMENTS

| | | | |
|---|---|---|---|
| 4,760,431 | 7/1988 | Nakagawa et al. | 357/23.4 |
| 4,914,496 | 4/1990 | Nakagawa et al. | 357/38 |
| 4,928,155 | 5/1990 | Nakagawa et al. | 357/23.4 |
| 4,954,869 | 9/1990 | Bauer | 357/38 |
| 4,956,690 | 9/1990 | Kato | 357/38 |
| 4,959,703 | 9/1990 | Ogura et al. | 357/38 |
| 4,963,972 | 10/1990 | Shinobe et al. | 357/38 |
| 5,014,102 | 5/1991 | Adler | 357/38 |
| 5,047,813 | 9/1991 | Harada | 257/341 |
| 5,086,323 | 2/1992 | Nakagawa et al. | 357/23.4 |
| 5,089,864 | 2/1992 | Sakurai | 357/23.4 |
| 5,091,766 | 2/1992 | Terashima | 357/38 |
| 5,093,701 | 3/1992 | Nakagawa et al. | 357/23.4 |
| 5,099,300 | 3/1992 | Baliga | 357/37 |
| 5,105,244 | 4/1992 | Bauer | 357/23.4 |
| 5,144,401 | 9/1992 | Ogura et al. | 357/38 |
| 5,241,194 | 8/1993 | Baliga | 257/133 |

FOREIGN PATENT DOCUMENTS 2-208976 8/1990 Japan ..................... 257/342

OTHER PUBLICATIONS

Baliga, Chang, Shafer and Smith, "The Insulated Gate Transistor (IGT) A New Power Switching Device," IEEE Industry Applications Society Meeting Digest, pp. 794–803, 1983.

Baliga, "Analysis of the Output Conductance of Insulated Gate Transistors," IEEE Electron Device Letters, vol. EDL-7, No. 12, pp. 686–688, Dec. 1986.

Mogro-Campero, Love, Chang and Dyer, "Shorter Trun-Off Times in Insulated Gate Transistors By Proton Implantation," IEEE Electron Device Letters, vol. EDL-6, No. 5, pp. 224–226, May, 1985.

Chow and Baliga, "Comparison of 300-, 600-, and 1200-V n-Channel Insulated Gate Transistors," IEEE Electron Device Letters, vol. EDL-6, No. 4, pp. 161–163, Apr. 1985.

(List continued on next page.)

Primary Examiner—Steven Ho Yin Loke
Attorney, Agent, or Firm—Bell, Seltzer, Park & Gibson

[57] ABSTRACT

A latch-up free insulated gate transistor includes an anode region electrically connected to an anode contact, a first base region on the anode region, a second base region on the first base region, connected to a cathode contact, an insulating region on the second base region and a field effect transistor on the insulating region, electrically connected between the cathode contact and the first base region. The field effect transistor provides an electrical connection between the first base region and the cathode contact in response to a turn-on bias signal. The insulating region prevents electrical conduction between the second base region and the field effect transistor and, in particular, suppresses minority carrier injection from the second base region to the source of the field effect transistor which is electrically connected to the cathode contact. The prevention of minority carrier injection reduces the likelihood of parasitic latch-up by cutting-off the regenerative P-N-P-N path that would otherwise exist between the anode and cathode. The insulating region is selected from the group consisting of $SiO_2$, $Si_3N_4$, $Al_2O_3$ and $MgAl_2O_4$ and is preferably formed using SIMOX processing techniques.

19 Claims, 3 Drawing Sheets

OTHER PUBLICATIONS

Kuo, Choi, Giandomenico, Hu, Sapp, Sassaman and Bregar, "Modeling the Turn–Off Characteristics of the Bipolar–MOS Transistor," IEEE Electron Device Letters, vol. EDL–6, No. 5, pp. 211–214, May, 1985.

Baliga, "Analysis of Insulated Gate Transistor Turn–Off Characteristics," IEEE Electron Device Letters, vol. EDL–6, No. 2, pp. 74–77, Feb. 1985.

Chow, Baliga and Gray, "A Self-Aligned Short Process For Insulated Gate Transistors," IEEE, IEDM–85, pp. 146–149, 1985.

Nakagawa, Yamaguchi, Watanabe, Ohashi and Kurata, "Experimental and Numerical Study of Non–Latch–Up Bipolar–Mode MOSFET Characteristics," IEEE, IEDM–85, pp. 150–153, 1985.

Chow, Baliga and Chang, "The Effect of Channel Length and Gate Oxide Thickness on the Performance of Insulated Gate Transistors," IEEE Transactions on Electron Devices, vol. ED–32, No. 11, p. 2554, Nov. 1985.

Nakagawa, Ohashi, Kurata, Yamaguchi and Watanbe, "Non–Latch–Up 1200V 75A Bipolar–Mode MOSFET with Large ASO," IEEE, IEDM–84, pp. 860–861, 1984.

Chang, Pifer, Yilmaz, Dyer, Baliga, Chow and Adler, "Comparison Of N and P Channel IGTs," IEEE, IEDM–84, pp. 278–281, 1984.

Baliga, Adler, Gray and Love, "Suppressing Latchup in Insulated Gate Transistors," IEEE Electron Device Letters, vol. EDL–5, No. 8, pp. 323–325, Aug. 1984.

Chang, Pifer, Baliga, Adler and Gray, "25 AMP, 500 Volt Insulated Gate Transistors," IEEE, IEDM–83, pp. 83–86, 1983.

Russell, A. M. Goodman, L. A. Goodman and Neilson, "The COMFET–A New High Conductance MOS–Gated Device," IEEE Electron Device Letters, vol. EDL–4, No. 3, pp. 63–65, Mar. 1983.

A. M. Goodman, Russell, L. A. Goodman, Nuese and Neilson, "Improved COMFETS with Fast Switching Speed and High–Current Capability," IEEE, IEDM–83, pp. 79–82, 1983.

Baliga, Adler, Gray and Love, "The Insulated Gate Rectifier (IGR): A New Power Switching Device," IEEE, IEDM–82, pp. 264–267, 1982.

Temple, "MOS Controlled Thyristors (MCT's)", IEDM–84, pp. 282–285, 1984.

Baliga, Adler, Love, Gray and Zommer, "The Insulated Gate Transistor: A New Three–Terminal MOS–Controlled Bipolar Power Device", IEEE Transactions on Electron Devices, vol. ED–31, No. 6, pp. 821–828, Jun. 1984.

Baliga and Chang, "The MOS Depletion–Mode Thyristor: A New MOS–Controlled Bipolar Power Device," IEEE Electron Device Letters, vol. 8, No. 8, pp. 411–413, Aug. 1988.

Baliga, "The MOS–Gated Emitter Switched Thyristor," IEEE Electron Device Letters (reprint), vol. 11, No. 2, pp. 75–77, Feb. 1990.

Nandakumar, Baliga, Shekar, Tandon and Reisman, "A New MOS–Gated Power Thyristor Structure with Turn–Off Achieved by Controlling the Base Resistance," IEEE Electron Letters, vol. 12, No. 5, pp. 227–229, May, 1991.

Shekar, Baliga, Nandakumar, Tandon and Reisman, "Characteristics of the Emitter–Switched Thyristor", IEEE Transactions on Electron Devices, vol. 38, No. 7, pp. 1619–1623, Jul. 1991.

Nandakumar, Baliga, Shekar, Tandon and Reisman, "The Base Resistance Controlled Thyristor (BRT) 'A New MOS Gated Power Thyristor'", IEEE, pp. 138–141, 1991.

Shekar, Baliga, Nandakumar, Tandon and Reisman, "Experimental Demonstration of the Emitter Switched Thyristor", pp. 128–131.

INSULATED GATE BIPOLAR TRANSISTOR WITH REDUCED SUSCEPTIBILITY TO PARASITIC LATCH-UP

CROSS REFERENCE TO RELATED APPLICATIONS

This application is related to application Ser. No. 07/990,659, entitled BASE RESISTANCE CONTROLLED THYRISTOR WITH INTEGRATED SINGLE POLARITY GATE CONTROL (Attorney Docket No. 5051-214); and Application Ser. No. 07/990,290, entitled EMITTER SWITCHED THYRISTOR WITH BURIED DIELECTRIC LAYER (Attorney Docket No. 5051-215); both filed concurrently herewith.

FIELD OF THE INVENTION

The present invention relates to semiconductor switching devices, and more particularly to transistors with gated turn-on and turn-off control.

BACKGROUND OF THE INVENTION

The development of semiconductor switching technology for high power applications in motor drive circuits, appliance controls and lighting ballasts, for example, began with the bipolar junction transistor. As the technology matured, bipolar devices became capable of handling large current densities in the range of 40–50 A/cm$^2$, with blocking voltages of 600 V.

Despite the attractive power ratings achieved by bipolar transistors, there exist several fundamental drawbacks to the suitability of bipolar transistors for all high power applications. First of all, bipolar transistors are current controlled devices. For example, a large control current into the base, typically one fifth to one tenth of the collector current, is required to maintain the device in an operating mode. Even larger base currents, however, are required for high speed forced turn-off. These characteristics make the base drive circuitry complex and expensive. The bipolar transistor is also vulnerable to breakdown if a high current and high voltage are simultaneously applied to the device, as commonly required in inductive power circuit applications, for example. Furthermore, it is difficult to parallel connect these devices since current diversion to a single device occurs at high temperatures, making emitter ballasting schemes necessary.

The power MOSFET was developed to address this base drive problem. In a power MOSFET, a gate electrode bias is applied for turn-on and turn-off control. Turn-on occurs when a conductive channel is formed between the MOSFET's source and drain regions under appropriate bias. The gate electrode is separated from the device's active area by an intervening insulator, typically silicon dioxide. Because the gate is insulated from the active area, little if any gate current is required in either the on-state or off-state. The gate current is also kept small during switching because the gate forms a capacitor with the device's active area. Thus, only charging and discharging current ("displacement current") is required. The high input impedance of the gate, caused by the insulator, is a primary feature of the power MOSFET. Moreover, because of the minimal current demands on the gate, the gate drive circuitry and devices can be easily implemented on a single chip. As compared to bipolar technology, the simple gate control provides for a large reduction in cost and a significant improvement in reliability.

These benefits are offset, however, by the high on-resistance of the MOSFET's active region, which arises from the absence of minority carrier injection. As a result, the device's operating forward current density is limited to relatively low values, typically in the range of 10 A/cm$^2$ for a 600 V device, as compared to 40–50 A/cm$^2$ for the bipolar transistor.

On the basis of these features of power bipolar transistors and MOSFET devices, hybrid devices embodying a combination of bipolar current conduction with MOS-controlled current flow were developed and, found to provide significant advantages over single technologies such as bipolar or MOSFET alone. Classes of such hybrid devices include various types of MOS-gated thyristors as well as the insulated gate bipolar transistor (IGBT), also commonly referred to by the acronyms COMFET (Conductivity-Modulated FET) and BIFET (Bipolar-mode MOSFET).

For example, in the insulated gate bipolar transistor (IGBT), disclosed in an article by inventor B. J. Baliga, and M. S. Adler, R. P. Love, P. V. Gray and N. Zommer, entitled "*The Insulated Gate Transistor: A New Three terminal MOS Controlled Bipolar Power Device.*" IEEE Trans. Electron Devices, ED-31, pp. 821-828 (1984), on-state losses were shown to be greatly reduced when compared to power MOSFETs. This was caused by the conductivity modulation of the IGBT's drift region during the on-state. In addition, very high conduction current densities in the range of 200-300 A/cm$^2$ can also be achieved. Accordingly, IGBTs were shown to have a conduction current density approximately 20 times that of equivalently-sized power MOSFETs and five (5) times that of equivalently-sized bipolar transistors. Typical turn-off times for the IGBT were also shown to be in the range of 10-50 μs. A cross-sectional representation of an insulated gate bipolar transistor with 600 volt blocking capability fabricated using a vertical DMOS process is shown in FIG. 1. FIG. 1 is a reproduction of FIG. 1 from the aforesaid Baliga, et al. article.

The operation of the IGBT can be described as follows with respect to the electrical schematic and I-V characteristics shown in FIGS. 1 and 2, respectively. In the reverse bias region, the anode is biased negative with respect to the cathode and the lower junction (J3) is reversed biased, thereby preventing conduction from the cathode to anode even though the upper junction (J2) is forward biased. This provides the device with its reverse blocking capability.

In its forward blocking state when the anode is biased positive with respect to the cathode and the gate and cathode are electrically connected, the upper junction (J2) is reversed biased and conduction is prevented. If, however, a positive gate bias of sufficient magnitude is applied to the gate, the P-base region under the gate becomes inverted and the device operates in its forward conducting mode as shown by the I-V characteristics on the right hand side of FIG. 2. In this mode of operation, electrons flow from the N+ source region into the N-base region via the channel (inversion layer) under the gate. In addition, the lower junction (J3) is forward biased and the substrate P+ region injects holes (minority carriers) into the N-base region. As the forward bias increases, the injected hole concentration increases until it exceeds the background doping level of the N-base. This high level minority carrier injection causes a conductivity modulation in the N-base and significantly reduces the IGBT's on-resistance.

As long as the gate bias is sufficiently large to produce enough charge in the inversion layer, the IGBT forward conduction characteristics will resemble those of a P-i-N diode, i.e., will follow the vertical portion of the I-V curves shown in FIG. 2. If the inversion layer conductivity is low, however, a substantial voltage drop across the channel will occur. This mode of operation represents the saturation region shown by the horizontal portions of the I-V curves in FIG. 2. As shown, higher gate voltages result in higher saturation current densities.

To switch the IGBT from its forward conducting mode of operation to its reverse blocking mode requires the removal of the positive gate bias to thereby cut off the supply of electrons from the N+ source region to the N-base region. Because of the high minority carrier concentration in the N-base region, turn-off of the IGBT is not immediate, but instead is dependent on the minority carrier recombination lifetime in the N-base region. Accordingly, the IGBT offers the potential for high forward conduction current density, full gate controlled transistor operation, low gate drive power requirements and reverse blocking capability providing directional power flow control.

One significant drawback to the operation of IGBTs at high current densities is the presence of the parasitic P-N-P-N structure between the anode and cathode which can cause a loss in the gate controlled turn-off capability. For example, the equivalent circuit for the IGBT shown schematically in FIG. 1 indicates the presence of a regenerative P-N-P-N path that can latch up if the lateral current in the P-base is sufficient to forward bias the P-base/N+ source junction. As will be understood by one skilled in the art, latch-up can be prevented so long as the sum of the current gains of the regeneratively coupled P-N-P and N-P-N transistors ($\alpha_{pnp}$, $\alpha_{npn}$) is less than unity.

The shorting resistance $R_s$ in FIG. 1 represents the short circuit resistance between the base (P-base) and emitter (N+ source) of the N-P-N transistor. The magnitude of $R_s$ is determined by the resistance of the P-base region and the distance between the edge of the N+ source region at point A and its contact point at point B. Because the current gain of the N-P-N transistor ($\alpha_{npn}$) is directly dependent on the magnitude of $R_s$, a small $R_s$ has been deemed essential for latch-up free operation at high forward current densities. When the P-base sheet resistance is kept low and/or the width of the N+ source region is kept small, electron injection from the N+ source region to the P-base can be suppressed because the uppermost P-N junction between the P-base and N+ source is effectively short circuited, thereby eliminating the regenerative P-N-P-N path from between the anode and cathode.

However, as described in an article by J. P Russell, A. M. Goodman, L. A. Goodman and J. M. Neilson, entitled "*The COMFET-A New High Conductance MOS-Gated Device*", IEEE Electron Device Letters, Vol EDL-4, No. 3, March (1983), pp. 63–65, even devices having a relatively low $R_s$ can be susceptible to latch-up if sufficiently large forward current densities cause significant emitter injection into the base of the N-P-N transistor and cause $\alpha_{npn}$ to increase. To reduce the likelihood of parasitic latch-up, the COMFET structure was modified to include a heavily doped P+ region in the middle of the P-base region, electrically connected to the cathode contact. To further lessen the magnitude of $R_s$, an aluminum contact was also provided for shorting the N+ source regions to the P-base region.

Other attempts have also be made to reduce the IGBT's susceptibility to latch-up. For example, in an article by A. M. Goodman, J. P. Russell, L. A. Goodman, C. J. Nuese and J. M. Neilson, entitled "*Improved COMFETs with Fast Switching Speed and High-Current Capability*", IEEE International Electron Devices Meeting Digest, Abstract 4.3, (1983), pp. 79–82, a highly doped (N+) epitaxial layer was formed on top of the P+ anode region at junction J3 in order to lower the gain of the lower P-N-P transistor ($\alpha_{pnp}$) and thereby reduce the likelihood of parasitic latch-up at high current densities.

A hole-bypass technique involving the elimination of one of the two uppermost N-type source regions from the uppermost P-base region is also described in an article by A. Nakagawa, H. Ohashi, M. Kurata, H. Yamaguchi and K. Watanabe, entitled "*Non-Latch-Up 1200 v 75A Bipolar-Mode MOSFET with Large ASO*" IEEE International Electron Devices Meeting Digest, Abstract 16.8, (1984), pp. 860–861. By eliminating the source region on one side of the P-base, the hole current collected by the base on that side is provided to the cathode contact without having to travel around the N+ source region. This bypass technique reduces the likelihood that the uppermost P-N junction between the P-base and N+ source will become forward biased at high current densities.

Notwithstanding these attempts to limit the susceptibility to sustained parasitic thyristor latchup, the presence of the N+ source region in the P-base poses a risk that under certain operating conditions parasitic latch-up will occur.

SUMMARY OF THE INVENTION

It is therefore an object of the present invention to provide a insulated gate bipolar transistor capable of handling high forward current densities and having low gate drive power requirements.

It is another object of the present invention to provide a transistor with reduced susceptibility to parasitic latch-up and having reverse blocking capability.

These and other objects are provided, according to the present invention, by an insulated gate bipolar transistor (IGBT) in a semiconductor substrate. The transistor has an anode region and a first base region of first conductivity type on the anode region, extending to a face of the semiconductor substrate. A second base region of second conductivity type is provided on the first base region. For a P-N-P insulated gate bipolar transistor, the second base region comprises a P-type region extending to the face at which it is electrically connected to a cathode contact. A source region is also provided in the substrate and is electrically connected to the cathode contact. The source region forms the source of a field effect transistor which is electrically connected between the cathode contact and the first base region. The field effect transistor provides the turn-on mechanism for the IGBT by electrically connecting the first base region to the cathode contact in response to a turn-on bias signal.

According to the invention, injection suppressing means is provided between the field effect transistor and the second base region for preventing minority carrier injection between the source region (N+) and the second base region (P-base). The injection suppressing means preferably comprises an insulating region, formed of a dielectric, on the second base region. The dielectric can be $SiO_2$, $Si_3N_4$, $Al_2O_3$, or $MgAl_2O_4$, as well as other conventional dielectric materials compatible with semiconductor device processing.

The source region is preferably on the insulating region, opposite the second base region, and the field effect transistor preferably extends from the source region onto the insulating region and to the first base region. Accordingly, the active region of the field effect transistor, i.e., the region wherein the channel is formed, is on the insulating region and preferably extends to the face of the semiconductor substrate. The gate control to the field effect transistor is also preferably provided on the face, above the active region.

To provide electrical isolation and thereby eliminate minority carrier injection between the source region and the second base region, the insulating region preferably extends from the first base region onto the second base region and to the face. The contact of the insulating region with the face is preferably between the junction of the source region and cathode contact and the junction of the second base region and cathode contact. Accordingly, the source region and second base region are separated by an insulating region and only make electrical contact indirectly via the cathode contact at the face.

Although minority carrier injection between the source region and the second base region is effectively prevented by the presence of the insulating region therebetween, parasitic latch-up is still possible if minority carrier injection between the source region and the active region of the field effect transistor occurs. In other words, parasitic latch-up is still possible if the source region acts as an emitter of minority carriers into the active region.

To suppress to the likelihood of minority carrier injection between the source and active regions, a relatively highly doped region of first conductivity type is preferably provided in the first base region, adjacent the active region. As will be understood by one skilled in the art, this relatively highly doped region acts as the drain region of the field effect transistor. The presence of this relatively highly doped region reduces the likelihood that minority carriers in the first base region will be injected into the active region of the field effect transistor and thereafter injected into the source region during forward conduction. Instead, minority carriers in the first base region will be collected by the second base region, thereby providing proper forward conduction characteristics.

For higher current applications, the insulated gate bipolar transistor of the present invention can take the form of a unit cell and can be replicated in a semiconductor substrate. The unit cells can therefore be connected in parallel with a single gate control being provided between adjacent unit cells.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
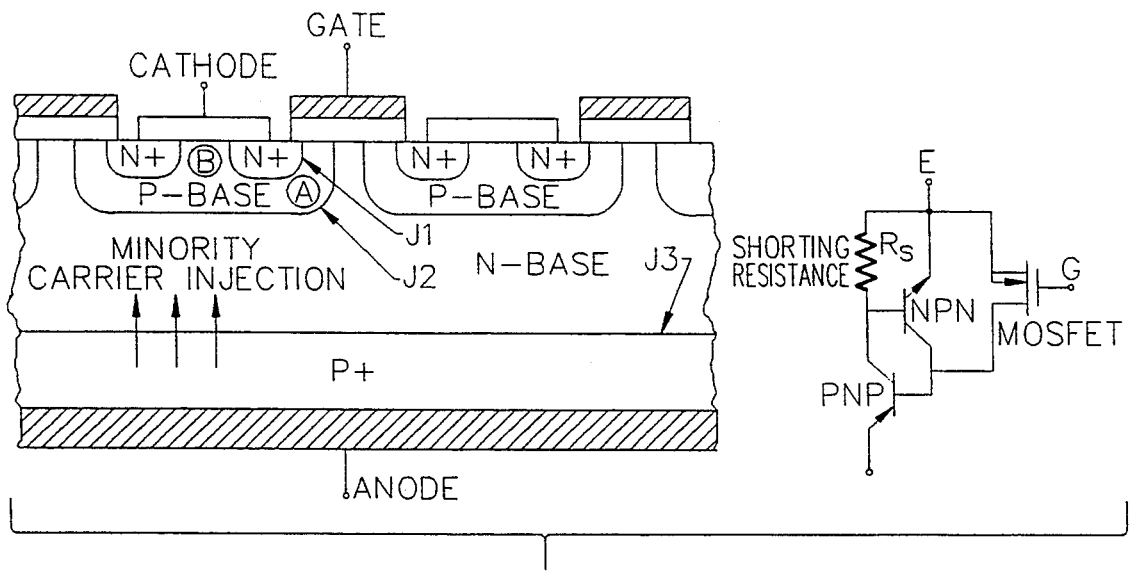
FIG. 1 illustrates a cross-sectional representation and equivalent electrical schematic of a prior art Insulated Gate Bipolar Transistor (IGBT).
Figure 2:
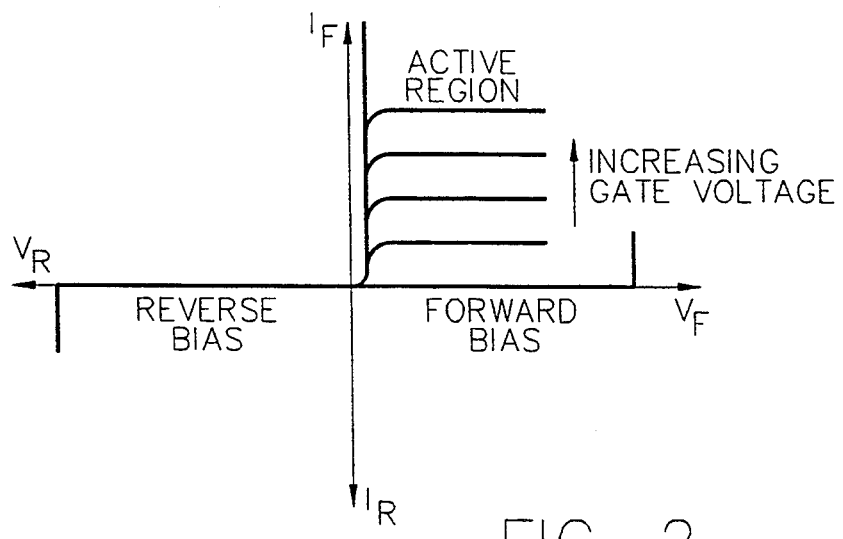
FIG. 2 illustrates the I-V characteristics for the IGBT shown in FIG. 1.
Figure 3:
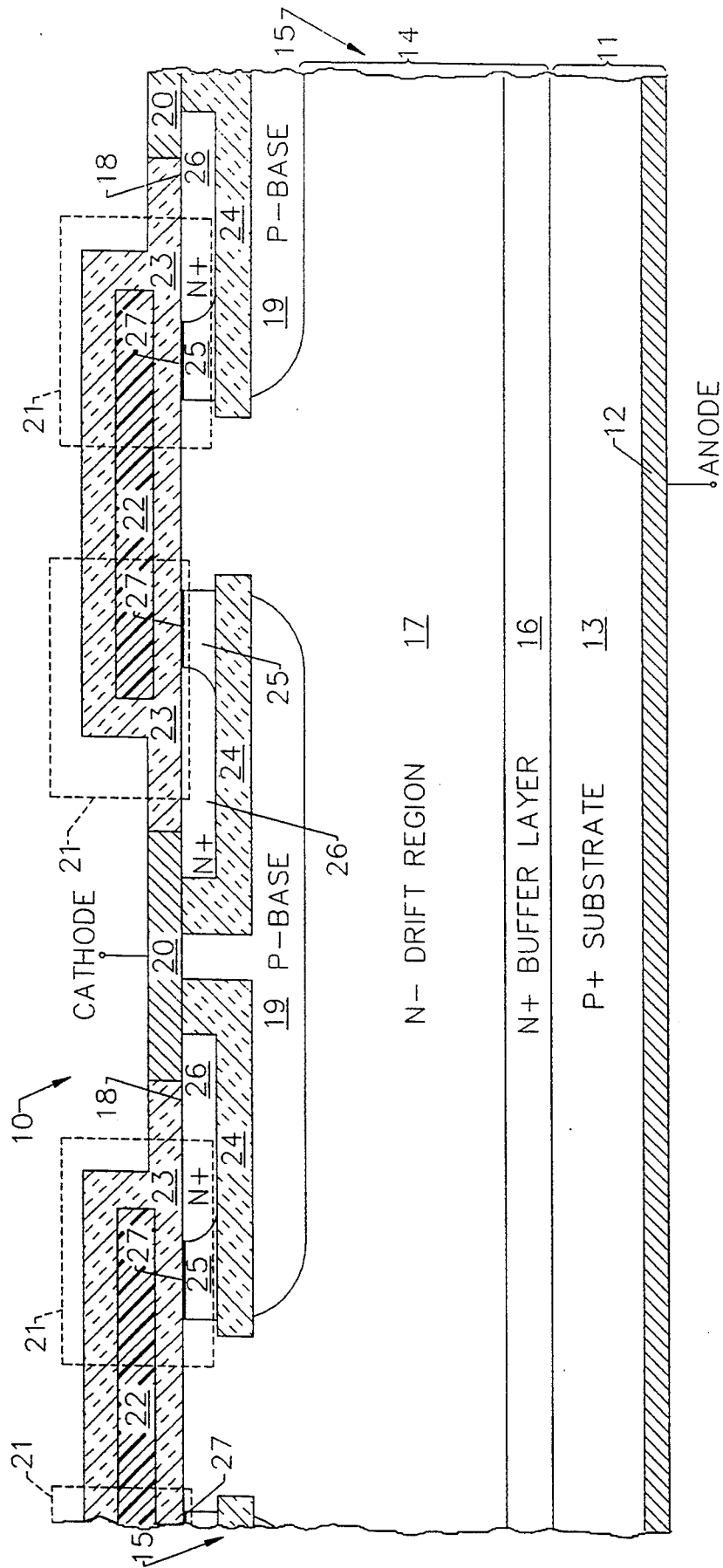
FIG. 3 illustrates a two-dimensional cross-sectional representation of an insulated gate bipolar transistor according to one embodiment of the present invention.

Referring now to FIG. 3, a two-dimensional representation of an insulated gate bipolar transistor 10 according to one embodiment of the present invention is shown. The insulated gate bipolar transistor 10 includes an anode region 11 and a first base region 14 on the anode region. The anode region includes an anode metallization contact 12 at a first face of a semiconductor substrate 15 and a highly doped region of second conductivity type 13 in the substrate 15, electrically connected to the anode metallization contact 12. The first base region of first conductivity type 14 preferably includes a relatively highly doped buffer layer 16 on the anode region 11. A more lightly doped drift region 17 is provided on the relatively highly doped buffer layer 16 and extends between the buffer layer 16 and a second face 18 of the semiconductor substrate 15.

A second base region 19 of second conductivity type is provided on the first base region 14 and electrically contacts the cathode contact 20 on the face 18. The anode region, first base region and second base region comprise the transistor portion of the present invention which is either a P-N-P, as shown, or an N-P-N bipolar transistor depending on the conductivity types of the various regions.

Transistor means 21 is also provided for electrically connecting the cathode contact 20 to the first base region 14 in response to a turn-on bias signal. In the preferred embodiment, transistor means 21 comprises a first conductivity type channel enhancement-mode MOSFET with a gate electrode 22 insulated from the substrate 15 by a gate dielectric layer 23 on face 18.

Injection suppressing means, comprising an insulating region 24, is provided on the second base region 19 and prevents carrier transfers between transistor means 21 and the second base region 19. In particular, the insulating region 24 prevents minority carrier injection between the source region 26 and the second base region 19. The insulating region 24 preferably extends from the cathode contact 20 onto the second base region 19 and to the first base region 14. The insulating region is preferably formed of a dielectric material selected from the group consisting of $SiO_2$, $Si_3N_4$, $Al_2O_3$ and $MgAl_2O_4$ and can include other dielectric materials compatible with semiconductor device processing. In terms of processing, the step for forming the second base region 19 preferably includes the use of conventional separation by implanted oxygen (SIMOX) technologies to form a buried dielectric layer.

The source region 26 forms the source of the N-channel enhancement-mode MOSFET in a P-N-P insulated gate bipolar transistor. The active region 25 is provided on the insulating region 24 and extends to the face 18. As will be understood by one skilled in the art, when a positive turn-on bias is applied to gate electrode 22, an N-type inversion channel 27 is created in the active region 25 and electrically connects the source region 26 to the first base region 14.

As shown, a plurality of parallel-connected insulated gate bipolar transistors 10 may be provided in the substrate 15. Accordingly, P-Base regions 19 may include second (center) and third (right side) base regions in the substrate 15. Similarly, respective first (center) and second (right side) insulating regions 24 and transistors 21 may also be provided. As shown and described, the junction of the cathode contact 20 with the second base region 19 and with the source region 26, respectively forms first and second ohmic contacts.

As will be understood by one skilled in the art, although transistor means 21 is shown in the substrate 15 in FIG. 3, it may also be provided on top of the substrate in another embodiment. Accordingly, the insulating region 24 may be provided on the face 18 and transistor means 21 may be provided on top of the insulating region using conventional techniques such as epitaxial lateral overgrowth (ELO) to form the active region of transistor means 21.

Figure 4:
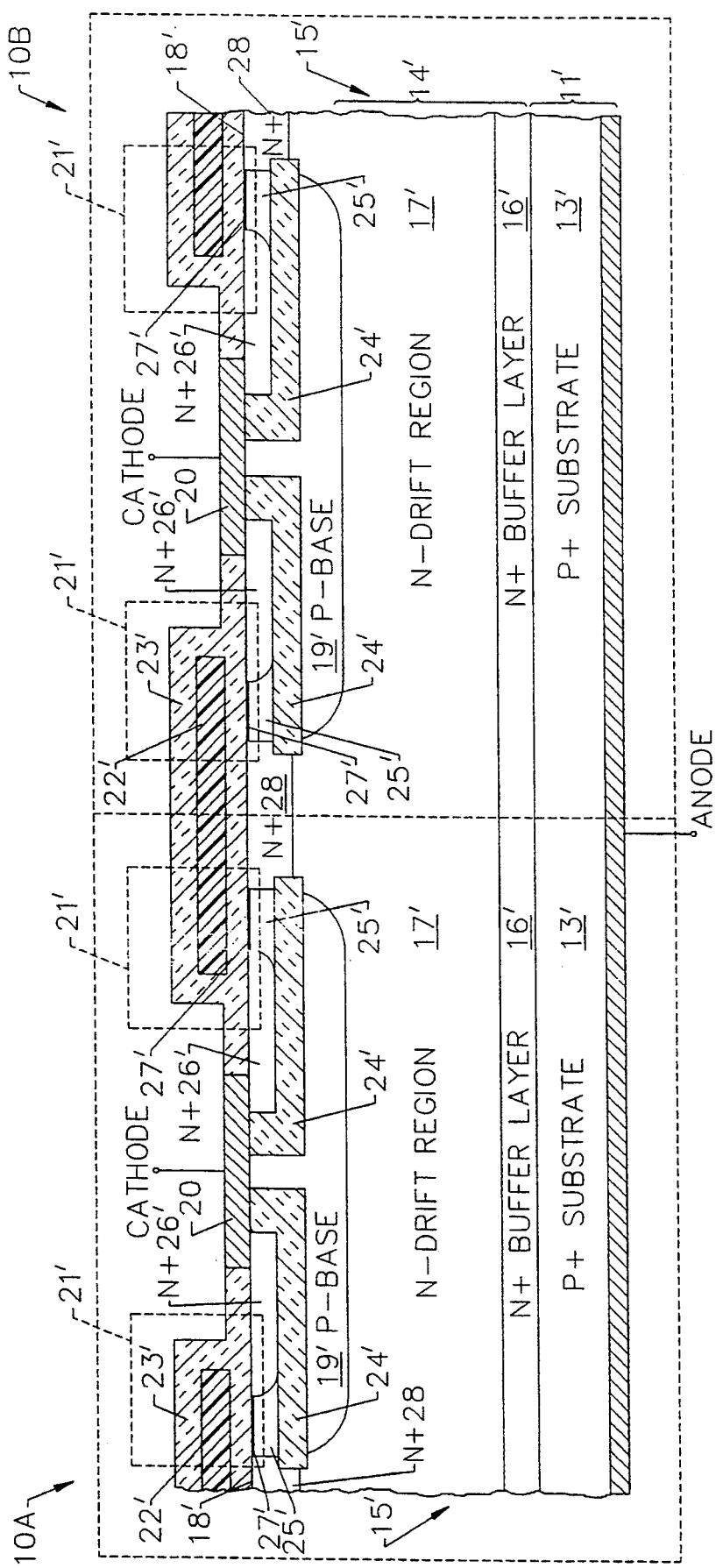
FIG. 4 illustrates a two-dimensional cross-sectional representation of an insulated gate bipolar transistor according to a second embodiment of the present invention.

Referring now to FIG. 4, a second preferred embodiment is shown. The regions marked with the added prime (') notation are identical in function to the numerically corresponding regions described with respect to FIG. 3. In particular, a relatively highly doped region 28 is included for improved forward conduction characteristics and for reduced susceptibility to parasitic latch-up. This is because the presence of region 28 reduces the likelihood that minority carriers in the first base region 17' (e.g., holes in a P-N-P IGBT) will be injected into the active region 25' during forward conduction. As will be understood by one skilled in the art, by preventing the injection of holes from the first base region 14' to the active region 25', the emission of electrons from the source region 26' to the active region 25' is also reduced. Accordingly, the presence of the relatively highly doped region 28 further reduces the likelihood that parasitic thyristor latch-up will occur between the anode region 11' and the source region 26', via regions 14', 28, and 25'.

As the embodiment of FIG. 4 further shows, multiple insulated gate bipolar transistor cells 10A, 10B can be provided side by side in a common substrate 15'. Preferably, transistor means 21' for adjacent cells can, in part, comprise a common gate electrode 22' and common relatively highly doped region 28 in the first base region 14'.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed:

1. A gate-controlled bipolar transistor, extending vertically in a semiconductor substrate between first and second opposing faces, comprising:
    an anode region adjacent said first face;
    a first base region of a first conductivity type on said anode region and forming a P-N junction therewith;
    a second base region of a second conductivity type on said first base region and extending to second face, said second base region forming a P-N junction with said first base region;
    a cathode contact on said second face, electrically contacting said second base region and forming a first ohmic contact therewith;
    a field effect transistor extending laterally in said substrate for electrically connecting said cathode contact and said first base region in response to a turn-on bias signal, said field effect transistor having a source region of said first conductivity type in said substrate, electrically contacting said cathode contact and forming a second ohmic contact therewith, and having an active region of said second conductivity type in said substrate; and
    an insulating region in said substrate, said insulating region extending to said second face and extending between said first ohmic contact and said second ohmic contact to thereby prevent electrical conduction from occurring in the semiconductor substrate, between said source region and said second base region.

2. The gate-controlled bipolar transistor of claim 1, wherein said field effect transistor comprises an n-channel enhancement-mode MOSFET.

3. An insulated gate bipolar transistor comprising:
    a semiconductor substrate having first and second opposing faces;
    an anode region in said substrate, extending to said first face;
    a first base region of a first conductivity type on said anode region, said first base region forming a P-N junction with said anode region;
    a second base region of a second conductivity type on said first base region, said second base region forming a P-N junction with said first base region and extending to said second face;
    a cathode contact on said second face, electrically connected to said second base region;
    transistor means responsive to a turn-on bias signal for electrically connecting said cathode contact and said first base region, said transistor means having a source region of said first conductivity type electrically connected to said cathode contact; and
    injection suppressing means, extending from said first base region onto said second base region and to said second face, for preventing minority carrier injection between said second base region and said source region.

4. The insulated gate bipolar transistor of claim 3, wherein said injection suppressing means comprises an insulating region and wherein said transistor means comprises a field effect transistor, on said insulating region and opposite said second base region, electrically connected between said cathode contact and said first base region.

5. The insulated gate bipolar transistor of claim 4, wherein said field effect transistor comprises a first conductivity type channel enhancement-mode MOSFET.

6. The insulated gate bipolar transistor of claim 5, wherein said insulating region is a dielectric material selected from the group consisting of $SiO_2$, $Si_3N_4$, $Al_2O_3$ and $MgAl_2O_4$.

7. The insulated gate bipolar transistor of claim 4, wherein said field effect transistor has a drain region contiguous with said first base region.

8. An insulated gate bipolar transistor comprising:

a semiconductor substrate having first and second opposing faces;

an anode region in said substrate, extending to said first face;

a first base region of a first conductivity type on said anode region;

a second base region of a second conductivity type on said first base region and extending to said second face;

a cathode contact at said second face, electrically connected to said second base region;

an insulating region extending from said first base region onto said second base region; and a field effect transistor on said insulating region, opposite said second base region and extending from said cathode contact onto said insulating region and to said first base region, said field effect transistor having an active region of said second conductivity type on said insulating region, and wherein said insulating region prevents electrical conduction between said active region and said second base region.

9. The insulated gate bipolar transistor of claim 8, wherein said field effect transistor comprises a first conductivity type channel enhancement-mode MOSFET at said second face and wherein said insulating region is a dielectric material selected from the group consisting of $SiO_2$, $Si_3N_4$, $Al_2O_3$ and $MgAl_2O_4$.

10. The insulated gate bipolar transistor of claim 8, wherein said field effect transistor has a source region on said insulating region, electrically connected to said cathode contact at said second face.

11. The insulated gate bipolar transistor of claim 10, wherein said field effect transistor has a drain region in said first base region and wherein said first base region is a relatively lightly doped region of said first conductivity type and wherein said drain region is a relatively highly doped region of said first conductivity type.

12. An insulated gate bipolar transistor comprising:
a semiconductor substrate having a face;
an anode region in said substrate;
a first base region of a first conductivity type on said anode region extending to said face;
a second base region of a second conductivity type on said first base region, extending to said face;
a third base region of said second conductivity type adjacent said second base region, extending to said face and separated from said second base region by said first base region;
a cathode contact on said face, electrically connected to said second and said third base regions;
a first insulating region on said second base region, extending from said cathode contact to said first base region;
a second insulating region on said third base region, extending from said cathode contact to said first base region;
a first field effect transistor, having an active region of said second conductivity type on said first insulating region, extending from said cathode contact onto said first insulating region and to said first base region; and
a second field effect transistor, having an active region of said second conductivity type on said second insulating region, extending from said cathode contact onto said second insulating region and to said first base region wherein said first insulating region electrically insulates said active region of said first field effect transistor from said second base region and wherein said second insulating region electrically insulates said active region of said second field effect transistor from said third base region.

13. The insulated gate bipolar transistor of claim 12, further comprising a relatively highly doped region of said first conductivity type at said face, between said second base region and said third base region and wherein said first base region is a relatively lightly doped region of said first conductivity type.

14. The insulated gate bipolar transistor of claim 13, wherein said first and said second field effect transistors comprise first conductivity type channel enhancement-mode MOSFETs.

15. The insulated gate bipolar transistor of claim 13, wherein each of said first and said second insulating regions is a dielectric material selected from the group consisting of $SiO_2$, $Si_3N_4$, $Al_2O_3$ and $MgAl_2O_4$.

16. An insulated gate bipolar transistor comprising:
a semiconductor substrate having first and second opposing faces;
an anode region of a second conductivity type in said substrate, at the first face;
a first base region of a first conductivity type in said substrate, extending between said anode region and the second face, said first base region forming a P-N junction with said anode region;
a cathode contact on the second face; and
a first insulated gate bipolar transistor cell in said substrate, said first cell comprising:
a second base region of said second conductivity type in said first base region, said second base region extending to the second face and ohmically contacting said cathode contact;
a first field effect transistor at the second face for providing an electrical connection between said cathode contact and said first base region in response to a turn-on gate bias signal, said first field effect transistor having a first active region of said second conductivity type which extends adjacent said second base region, and a first source region of said first conductivity type which extends adjacent said second base region and ohmically contacts said cathode contact at the second face; and
a first electrical insulating region in said substrate, extending from said first base region to the second face, said first insulating region formed adjacent to said first source region in said substrate to thereby prevent minority carrier injection between adjacent portions of said first source region and said second base region.

17. The insulated gate bipolar transistor of claim 16, further comprising a second insulated gate bipolar transistor cell in said substrate and adjacent said first cell, said second cell comprising:
a third base region of said second conductivity type in said first base region, said third base region extending to the second face and ohmically contacting said cathode contact;
a second field effect transistor at the second face for providing an electrical connection between said cathode contact and said first base region in response to a turn-on gate bias signal, said second field effect transistor having a second active region of said second conductivity type which extends adjacent said third base region, and a second source region of said first conductivity type which extends adjacent said third base region and ohmically contacts said cathode contact at the second face; and a second electrical insulating region in said substrate, extending from said first base region to the second face, said second insulating region formed adjacent to said second source region in said substrate to thereby prevent minority carrier injection between adjacent portions of said second source region and said third base region.

18. The insulated gate bipolar transistor of claim 17, further comprising a relatively highly doped region of said first conductivity type in said substrate, between said first active region and said second active region.

19. The insulated gate bipolar transistor of claim 18, wherein said relatively highly doped region extends adjacent said first active region, between said first insulating region and the second face, and also extends adjacent said second active region, between said second insulating region and the second face.

* * * * *